United States Patent
Kim et al.

(10) Patent No.: US 9,407,289 B2
(45) Date of Patent: Aug. 2, 2016

(54) METHOD OF OPERATING CYCLIC REDUNDANCY CHECK IN MEMORY SYSTEM AND MEMORY CONTROLLER USING THE SAME

(71) Applicant: Samsung Electronics Co., Ltd, Suwon-si, Gyeonggi-do (KR)

(72) Inventors: Nam-shik Kim, Seoul (KR); Dae-wook Kim, Osan-si (KR); Bi-woong Chung, Yongin-si (KR); Jun-jin Kong, Yongin-si (KR)

(73) Assignee: SAMSUNG ELECTRONICS CO., LTD., Yeongtong-gu, Suwon-si, Gyeonggi-do (KR)

( * ) Notice: Subject to any disclaimer, the term of this patent is extended or adjusted under 35 U.S.C. 154(b) by 264 days.

(21) Appl. No.: 14/045,001

(22) Filed: Oct. 3, 2013

(65) Prior Publication Data

US 2014/0101513 A1    Apr. 10, 2014

(30) Foreign Application Priority Data

Oct. 4, 2012    (KR) .......................... 10-2012-0110092

(51) Int. Cl.
*H03M 13/00* (2006.01)
*H03M 13/09* (2006.01)
*G06F 11/10* (2006.01)

(52) U.S. Cl.
CPC ......... *H03M 13/095* (2013.01); *G06F 11/1004* (2013.01); *H03M 13/09* (2013.01); *H03M 13/091* (2013.01)

(58) Field of Classification Search
CPC . H03M 13/095; H03M 13/09; H03M 13/091; H03M 13/116; G06F 11/1004

USPC ........... 714/758, 763, 781, 716, 752; 377/72, 377/81

See application file for complete search history.

(56) References Cited

U.S. PATENT DOCUMENTS

| | | | |
|---|---|---|---|
| 5,539,756 A | | 7/1996 | Glaise et al. |
| 6,052,815 A | * | 4/2000 | Zook ............................. 714/758 |
| 6,272,187 B1 | | 8/2001 | Rick |
| 6,327,691 B1 | * | 12/2001 | Huang ........................... 714/781 |
| 7,124,351 B2 | | 10/2006 | Aldridge et al. |
| 7,219,293 B2 | | 5/2007 | Tsai et al. |
| 8,843,810 B2 | * | 9/2014 | Lu ................................. 714/781 |

(Continued)

FOREIGN PATENT DOCUMENTS

| | | |
|---|---|---|
| JP | 06-013915 | 1/1994 |
| JP | 08-149017 | 6/1996 |

(Continued)

*Primary Examiner* — Christine Tu
(74) *Attorney, Agent, or Firm* — Muir Patent Law, PLLC

(57) ABSTRACT

A method of performing a cyclic redundancy check (CRC) operation in a memory system, and a memory controller that uses the same. The method includes initializing a linear feedback shift register (LFSR) circuit in a CRC polynomial, generating CRC parity information with respect to input data to be stored in a memory device by using the LFSR circuit, and generating a CRC code with respect to the input data based on the CRC parity information, such that the initialization of the LFSR circuit is set such that a register initial value of the LFSR circuit is determined to satisfy a condition that, when data input to the LFSR circuit is first state information, the CRC parity information generated from the LFSR circuit is second state information.

19 Claims, 14 Drawing Sheets

(56) References Cited

U.S. PATENT DOCUMENTS

2007/0016842 A1    1/2007    Samuel et al.
2012/0079348 A1    3/2012    Naeimi

FOREIGN PATENT DOCUMENTS

JP    2000-101450    4/2000
KR    10-0578721    5/2006

\* cited by examiner

METHOD OF OPERATING CYCLIC REDUNDANCY CHECK IN MEMORY SYSTEM AND MEMORY CONTROLLER USING THE SAME

CROSS-REFERENCE TO RELATED APPLICATIONS

This application claims priority under 35 USC §119 from Korean Patent Application No. 10-2012-0110092, filed on Oct. 4, 2012, in the Korean Intellectual Property Office, the disclosure of which is incorporated herein in its entirety by reference.

BACKGROUND

1. Field

The present general inventive concept relates to a memory system and a method of detecting an error in the memory system, and more particularly, to a method of performing a cyclic redundancy check operation in a memory system, and a memory controller using the same.

2. Description of the Related Art

Memory devices are used to store data, and are classified into volatile memory devices and non-volatile memory devices. The characteristics of the memory devices may vary according to using environment, the number of uses or using time. Accordingly, there is a need to develop a technique to effectively check errors that occur in a data transmitting process in a memory system including the memory devices.

SUMMARY

The present general inventive concept provides a method of performing a cyclic redundancy check (CRC) operation in a memory system to effectively detect an error that occurs in a data transmitting process.

The present general inventive concept also provides a memory controller to effectively detect an error that occurs in a data transmitting process.

Additional features and utilities of the present general inventive concept will be set forth in part in the description which follows and, in part, will be obvious from the description, or may be learned by practice of the general inventive concept.

The foregoing and/or other features and utilities of the present general inventive concept are achieved by providing a method of operating a CRC operation in a memory system, the method including initializing a linear feed-back shift register (LFSR) circuit in a CRC polynomial, generating CRC parity information with respect to input data to be stored in a memory device by using the LFSR circuit, and generating a CRC code with respect to the input data based on the CRC parity information, wherein the initialization of the LFSR circuit is set such that a register initial value of the LFSR circuit is determined to satisfy a condition that, when data input to the LFSR circuit is first state information, the CRC parity information generated from the LFSR circuit is second state information.

Bit values of the first state information and the second state information may have the same pattern.

The first state information and the second state information respectively may determine all bit values as "1".

The first state information and the second state information may be determined as the same pattern of information read from a clean sector where no data are written in the memory device.

The register initial value of the LFSR circuit may be determined by using operated vector values a in a state that input data m0~mL is set as the first state information and all g0~gn are set as "0" in a matrix that expresses an operation process of the LFSR circuit as shown below, (here, r0~rn are CRC parity information, m0~mL is input data, g0~gn are register values of the LFSR circuit, g(x) is CRC polynomial, and L is a length of input data row).

$$\begin{bmatrix} r_0 \\ r_1 \\ \vdots \\ r_n \end{bmatrix} = A(g(x), L) \underbrace{\begin{bmatrix} m_0 \\ m_1 \\ \vdots \\ m_L \end{bmatrix}}_{a} + B(g(x), L) \begin{bmatrix} g_0 \\ g_1 \\ \vdots \\ g_n \end{bmatrix}$$

The register initial value of the LFSR circuit may be determined such that, after performing an XOR operation of the vector values a and a vector having the second information, an inverse matrix of the matrix B which is already determined is multiplied to the value resulting from the XOR operation.

The generating of the CRC code may include generating the CRC code with respect to the input data by adding the CRC parity information to the input data.

The foregoing and/or other features and utilities of the present general inventive concept may also be achieved by providing a memory controller including a central processing unit (CPU) to perform a control operation on a memory device so that the memory device perform a copy-back operation by which data stored in a source page is moved to a target page, and a CRC processing unit to perform a CRC encoding or decoding process on the input data according to the copy-back operation by using an LFSR circuit that corresponds to a CRC polynomial, wherein a register initial value of the LFSR circuit is determined to satisfy a condition that, when data input to the LFSR circuit is first state information, the CRC parity information generated from the LFSR circuit is second state information.

The first state information and the second state information may determine the same pattern of information that is read from a clean sector where no data is recorded written in the memory device.

The first state information and the second state information respectively may determine all bit values as "1".

The LFSR circuit may be configured of a plurality of registers and XOR gates, may be configured to determine the connection between input bit values of data and the registers based on a CRC polynomial, may be configured to apply a value that is obtained by an XOR operation of an output value of a front-end register and the input bit value to an input terminal of the register that corresponds to a degree included in the CRC polynomial, and may be configured to apply an output value of the front-end register to the input terminal of the register that corresponds to a degree that is not included in the CRC polynomial.

The memory device may include a flash memory device.

The CRC processing unit may generate a frame check sequence (FCS) information by inputting a CRC code read from the source page to the LFSR circuit according to the copy-back operation, and performs a CRC decoding process that checks defectiveness of data included in the CRC code based on the FCS information.

The CRC processing unit may generate parity information by inputting data that is verified as non-defective by performing the CRC decoding process with respect to the CRC code read from the source page according to the copy-back operation, and performs a CRC encoding process that generates a CRC code by adding the CRC parity information to the data input to the LFSR circuit.

The CRC processing unit may include the LFSR circuit that is configured to perform an operation corresponding to the CRC polynomial with respect to the input data, and an initial value controller that initializes registers that constitute the LFSR circuit with a target initial value, wherein the target initial value is determined to satisfy a condition that when data input to the LFSR circuit is first state information, the CRC parity information generated from the LFSR circuit is second state information.

The foregoing and/or other features and utilities of the present general inventive concept may also be achieved by providing a memory system, including a memory device to store a plurality of data blocks, a central processing unit (CPU) to select a victim block from among the plurality of data blocks in response to a determination that a number of free blocks in the memory device is smaller than a critical number of free blocks that are initially set, and a cyclic redundancy check (CRC) processing unit to perform a CRC encoding operation on CRC decoded data read from a valid page of the victim block by using a linear feed-back shift register (LFSR) circuit that corresponds to a CRC polynomial, and a memory controller to copy the CRC encoded data to an empty page of a free block or an active block of the memory device.

The victim block may be a block of the memory device having a most amount of invalid pages stored therein from among the plurality of data blocks.

The free block may be a block of the memory device in which data is not stored.

The active block may be a block of the memory device in which data is stored and has spare pages where data can be stored.

The memory controller may control the memory system to copy data stored in the valid page that exists in the victim block to a free block in response to the active block not being present.

The CRC encoding operation may include dividing the CRC decoded data by the CRC polynomial and adding a remainder to an end portion of the CRC decoded data.

The CRC processing unit may decode the data read from the valid page of the victim block by dividing the data read from the valid page of the victim block by a predetermined polynomial to determine whether the remainder is zero.

The CPU may generate error report information if the remainder is not zero, and may perform the CRC encoding operation if the remainder is zero.

BRIEF DESCRIPTION OF THE DRAWINGS

These and/or other features and utilities of the present general inventive concept will become apparent and more readily appreciated from the following description of the embodiments, taken in conjunction with the accompanying drawings of which.

DETAILED DESCRIPTION OF THE PREFERRED EMBODIMENTS

Figure 1:
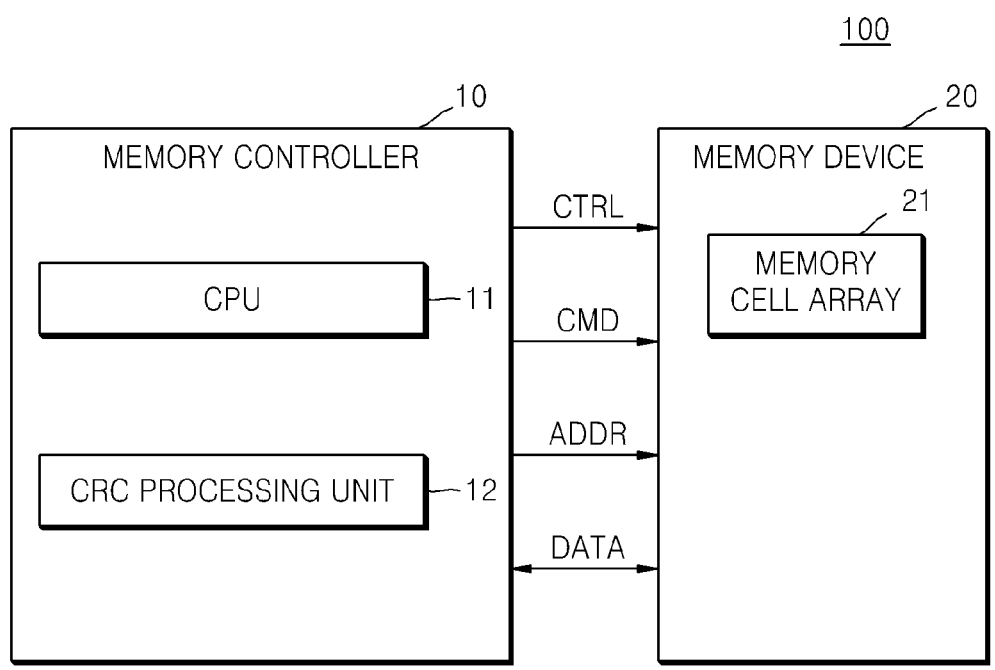
FIG. 1 is a block diagram schematically illustrating a memory system according to an exemplary embodiment of the present general inventive concept.

Reference will now be made in detail to the embodiments of the present general inventive concept, examples of which are illustrated in the accompanying drawings, wherein like reference numerals refer to the like elements throughout. The embodiments are described below in order to explain the present general inventive concept while referring to the figures.

It should be understood, however, that there is no intent to limit exemplary embodiments to the particular forms disclosed, but on the contrary, example embodiments are to cover all modifications, equivalents, and alternatives falling within the scope of the invention. Like numbers refer to like elements throughout the description of the figures. In the drawings, dimensions of structures may be exaggerated or reduced than actual sizes for clarity.

The terms used herein is for the purpose of describing particular embodiments only and is not intended to be limiting of the invention. The singular forms include the plural forms unless the context clearly indicates otherwise. It will further understood that the terms "comprise" and/or "comprising" when used in this specification, specify the presence of stated features, integers, operations, operations, elements, and/or components, but do not preclude the presence or addition of one or more other features, integers, operations, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used in dictionaries, should be interpreted as having a meaning that is consistent with their meaning in the context of the relevant art and will not be interpreted in an idealized or overly formal senses unless expressly so defined herein.

FIG. 1 is a block diagram schematically illustrating a memory system 100 according to an exemplary embodiment of the present general inventive concept.

Referring to FIG. 1, the memory system 100 may include a memory controller 10 and a memory device 20. The memory controller 10 may perform a control operation on the memory device 20, and more specifically, the memory controller 10 may control operations of programming (or writing), reading, and erasing with respect to the memory device 20 by providing an address ADDR, a command CMD, and a control signal CTRL to the memory device 20. Hereinafter, composition elements included in the memory controller 10 and the memory device 20 will be described.

The memory device 20 may include a memory cell array 21. The memory cell array 21 may include a plurality of memory cells that are disposed in regions where a plurality of word lines cross a plurality of bit lines. In the current embodiment of the present general inventive concept, the memory cells may be flash memory cells, and the memory cell array 21 may be a NAND flash memory cell array or an NOR flash memory cell array. Hereinafter, exemplary embodiments of the present general inventive concept are directed to the memory cells being flash memory cells as an example. However, the present general inventive concept is not limited thereto, that is, in other exemplary embodiments, the memory cells may include resistive memory cells such as resistive RAMs (RRAMs), phase change RAMs (PRAMs), or magnetic RAMs (MRAMs).

The memory controller 10 may include a central processing unit (CPU) 11 and a cyclic redundancy check (CRC) processing unit 12.

The CPU 11 controls overall operation of the memory system 100. The CPU 11 interprets a command received from a host (not illustrated), and controls the memory system 100 to perform an operation in response to the interpretation result. For example, the CPU 11 may perform a control operation on the memory device 20 so that the memory device 20 performs a copy-back operation by which data stored in a source page is moved to a target page. Also, the CPU 11 may control the memory system 100 so that the memory system 100 performs a method of performing a CRC operation and a method of processing garbage collection in the memory system according to exemplary embodiments of the present general inventive concept, as depicted in the flowcharts of FIGS. 11 through 14.

The CRC processing unit 12 performs a CRC encoding or decoding process on input data by using a linear feed-back shift register (LFSR) circuit that corresponds to a CRC polynomial.

The CRC is an error detection method of verifying the reliability of data in a data transmission-receiving system. More specifically, in a CRC encoding operation, input data to be stored in the memory device 20 is divided by a predetermined polynomial, and a CRC code is generated by adding the remainder to an end portion of the input data. As an example, when input data to be stored in the memory device 20 is divided by a predetermined polynomial, the remainder information is referred to as frame check sequence (FCS) information or CRC parity information. That is, in the CRC encoding operation, a CRC code is generated by adding the CRC parity information to the data.

Also, in the CRC decoding operation, the CRC code, which is information read out and transmitted from the memory device 20 is divided by a predetermined polynomial to see whether the remainder is 0, and then, it is determined whether the data is correct. In the CRC decoding operation, if the remainder is 0, it is determined that there is no error, and if the remainder is not 0, it is determined that there is an error.

For example, the CRC processing unit 12 may perform a CRC encoding or decoding process on the input data according to a copy-back operation by using an LFSR circuit that corresponds to a CRC polynomial that is initially set-up. The copy-back operation denotes the movement of data stored in a source page of the memory device 20 to a target page.

In the current exemplary embodiment, when the data input to the LFSR circuit is first state information, the initial value of the LFSR circuit is determined such that CRC parity information generated from the LFSR circuit satisfies a condition to be second state information. For example, all of the first and second state information may be determined as the same pattern of information that is read out in a clean sector where there is no recorded data in the memory device 20. For example, the first and second information respectively may determine all bit values as "1". The LFSR circuit will be described in detail below.

Figure 2:
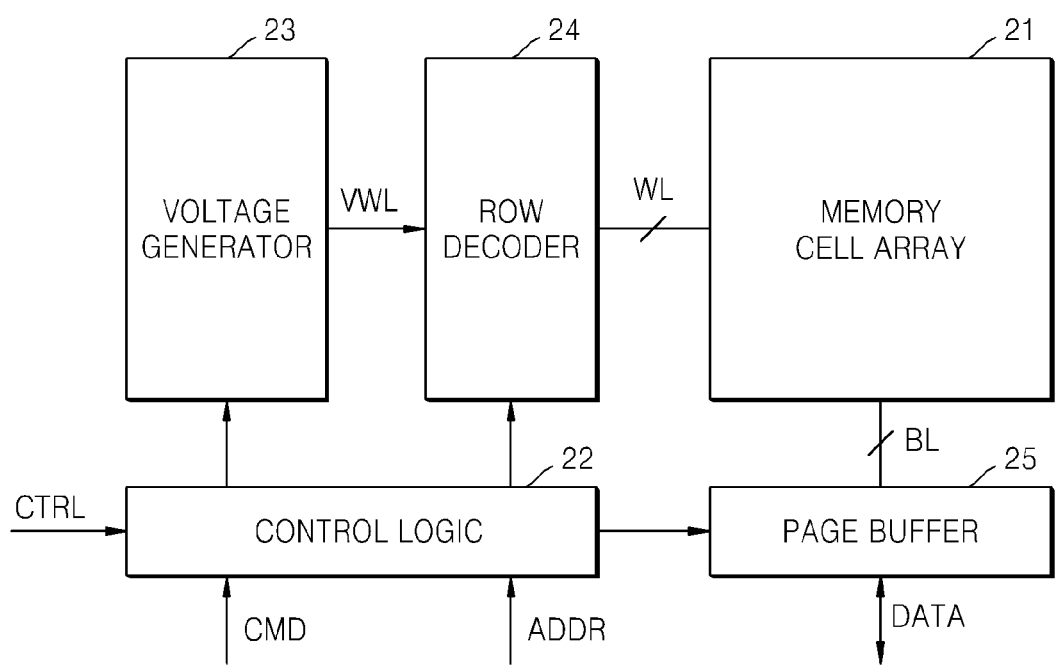
FIG. 2 is a block diagram illustrating a memory device included in the memory system of FIG. 1 in detail.

FIG. 2 is a block diagram illustrating the memory device 20 included in the memory system 100 of FIG. 1 in detail.

Referring to FIG. 2, the memory device 20 may include the memory cell array 21, a control logic 22, a voltage generator 23, a row decoder 24, and a page buffer 25.

The control logic 22 may output various control signals to write data to the memory cell array 21 or read-out data from the memory cell array 21 based on a command CMD, address ADDR, and control signal CTRL received from the memory controller 10. A control signal output from the control logic 22 may be transmitted to the voltage generator 23, the row decoder 24, and the page buffer 25.

The voltage generator 23 may generate a driving voltage VWL to drive a plurality of word lines WL based on a control signal received from the control logic 22. More specifically, the driving voltage VWL may be a writing voltage (programming voltage), a reading voltage, an erasing voltage, or a pass voltage.

The row decoder 24 may activate some of the word lines WL based on a row address. More specifically, in a reading operation, the row decoder 24 may apply a reading voltage to the selected word lines and may apply a pass voltage to the non-selected word lines. In a writing operation, the row decoder 24 may apply a writing voltage to the selected word lines and may apply a pass voltage to the non-selected word lines.

The page buffer 25 may be connected to the memory cell array 21 through a plurality of bit lines BL. The page buffer 25 may temporarily store data to be recorded in the memory cell array 21 or data read out from the memory cell array 21.

Figure 3:
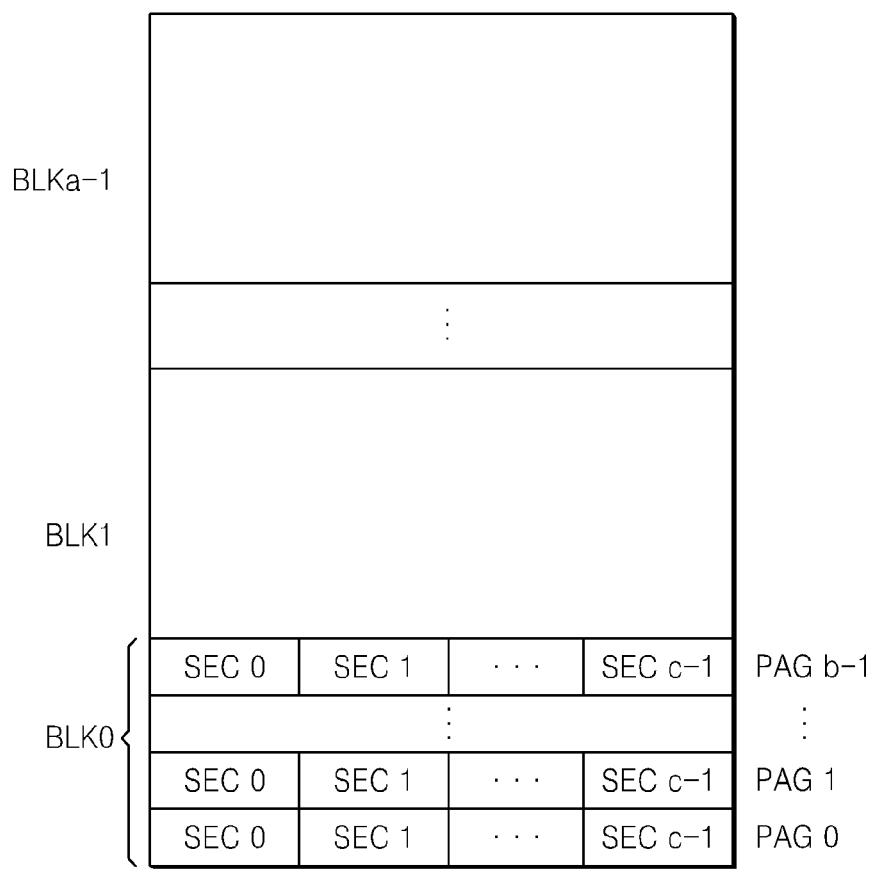
FIG. 3 is an example of memory cell array included in the memory device of FIG. 2.

FIG. 3 is an example of the memory cell array 21 included in the memory device 20 of FIG. 2.

Referring to FIG. 3, the memory cell array 21 may be a flash memory cell array. The memory cell array 21 may include a number (a is an integer greater than 2) of blocks (BLK 0 through BLKa-1), such that each of the blocks (BLK 0 through BLKa-1) may include b (b is an integer greater than 2) number of pages (PAG0 through PAGb-1), and each of the pages (PAG0 through PAGb-1) may include c (c is an integer greater than 2) number of sectors (SEC0 through SECc-1). In FIG. 3, for convenience of explanation, the pages (PAG0 through PAGb-1) and the sectors (SEC0 through SECc-1) with respect to only the BLK0 are depicted. That is, other blocks (BLK1 through BLKa-1) may also have the same structure as that of the BLK0.

Figure 4:
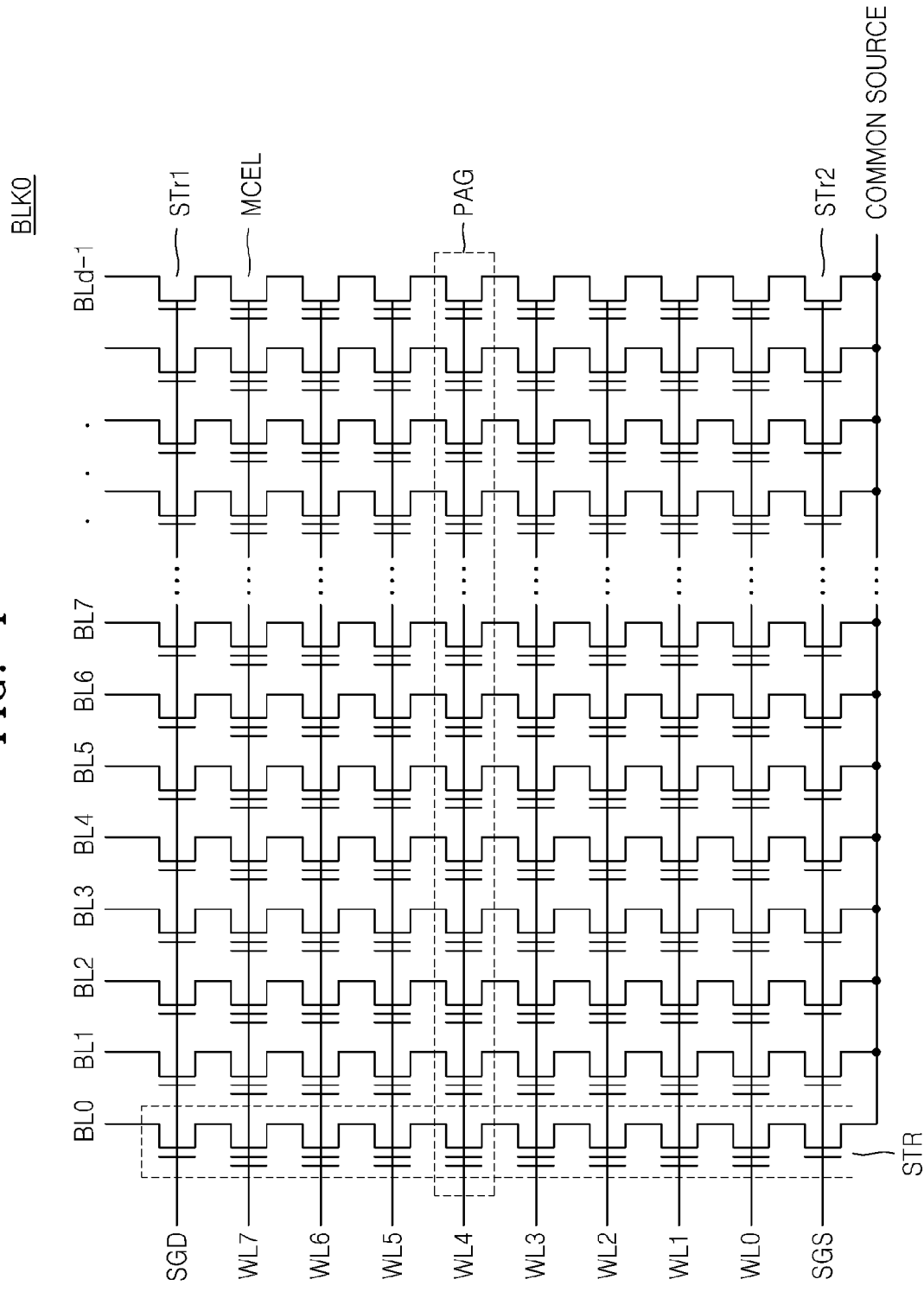
FIG. 4 is a circuit diagram illustrating an example of a memory block included in the memory cell array of FIG. 3.

FIG. 4 is a circuit diagram illustrating an example of a memory block included in the memory cell array 21 of FIG. 3.

Referring to FIG. 4, the memory cell array 21 may be a memory cell array of a NAND flash memory. Each of the blocks (BLK 0 through BLKa-1) depicted in FIG. 3 may be applied as depicted in FIG. 4. Referring to FIG. 4, each of the blocks (BLK 0 through BLKa-1) may include d (d is an integer greater than 2) number of strings STR in which 8 memory cells MCEL are connected in series in a bit line (BL0 through BLd-1) direction. Each of the strings STR may include a drain select transistor Str1 and a source select transistor Str2 respectively connected to both ends of the memory cells MCEL which are connected in a series.

A NAND flash memory device having a structure as depicted in FIG. 4 performs an erase in block units, and performs a program in a page PAG unit that corresponds to each of the word lines (WL0 through WL7). In FIG. 4, as an example, one block includes 8 pages PAG with respect to the 8 word lines (WL0 through WL7). However, the blocks (BLK 0 through BLKa-1) of the memory cell array 21 according to the current exemplary embodiment may include a different number of memory cells and pages from the number of memory cells MCEL and pages PAG depicted in FIG. 4. Also, the memory device 20 of FIG. 1 may include a plurality of memory cell arrays that have the same structure and the same operation as the memory cell array 21 described above.

Figure 5:
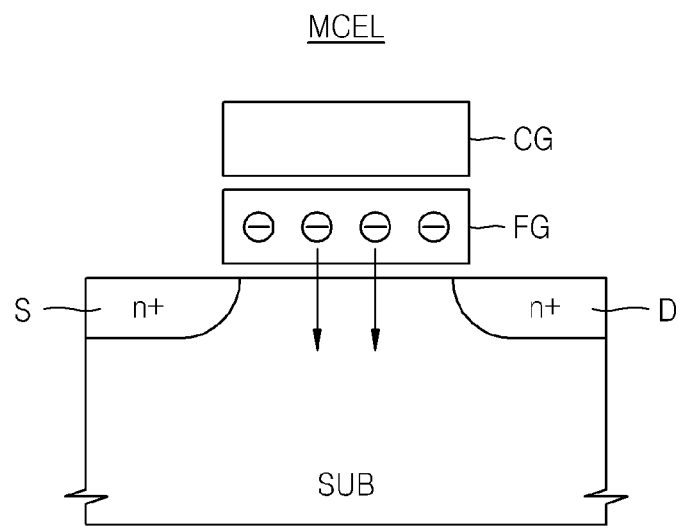
FIG. 5 is a cross-sectional view of an example of a memory cell included in the memory block of FIG. 4.

FIG. 5 is a cross-sectional view of an example of a memory cell MCEL included in the memory block (BLK0) of FIG. 4.

Referring to FIG. 5, a source S and a drain D may be formed on a substrate SUB, and a channel region may be formed between the source S and the drain D. A floating gate FG may be formed above the channel region, and an insulating layer such as a tunneling insulating layer may be disposed between the channel region and the floating gate FG. A control gate CG may be formed above the floating gate FG, and an insulating layer such as a blocking insulating layer may be disposed between the floating gate FG and the control gate CG. Voltages for a programming, an erasing, and a reading operation on the memory cell MCEL may be applied to the substrate SUB, the source S, the drain D, and the control gate CG.

In a flash memory device, data stored in the memory cell MCEL may be read out by distinguishing a threshold voltage Vth of the memory cell MCEL. At this point, the threshold voltage Vth of the memory cell MCEL may be determined according to the amount of electrons stored in the floating gate FG. More specifically, the more the electrons stored in the floating gate FG, the higher the threshold voltage Vth of the memory cell MCEL.

Electrons stored in the floating gate FG of the memory cell MCEL may leak due to various reasons in a direction as indicated by the arrows, and accordingly, the threshold voltage Vth of the memory cell MCEL may vary. For example, electrons stored in the floating gate FG may leak due to wearing of the memory cell MCEL. More specifically, when access operations such as programming, erasing, or reading with respect to the memory cell MCEL are repeated, the insulating layer between the channel region and the floating gate FG may wear, and accordingly, the electrons stored in the floating gate FG may leak. As another example, electrons stored in the floating gate FG may leak due to a temperature difference that occurs when there is high temperature stress or programming/reading data. The leakage of electrons may be a cause of reducing the reliability of a memory device.

In the flash memory device, recording and reading data are performed in page units, and electrical erase is performed in block units. Also, before recording data, an electrical erasing operation of the block is needed. Accordingly, an overwriting operation is impossible.

In a memory device in which an overwriting operation is impossible, user data may not be written in a physical region where the user wants. Accordingly, when an access to write or read is requested by a host, it is necessary to perform an address conversion operation of converting a logical address requested by the host to write or read to or from a physical address where actual data is stored or to be stored.

In the memory system 100, a process of converting a logical address to a physical address will be described with reference to FIG. 6.

Figure 6:
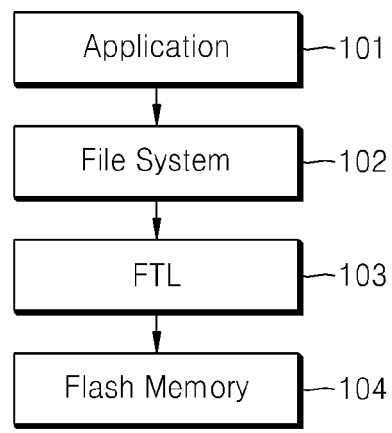
FIG. 6 is a drawing illustrating an example of a software structure of the memory system of FIG. 1.

FIG. 6 is a block diagram illustrating an example of a software structure of the memory system 100 of FIG. 1. As an example, FIG. 6 illustrates a software structure of the memory system 100 in which the memory device 20 that comprises the memory system 100 is realized by using a flash memory device.

Referring to FIG. 6, the memory system 100 has a software layer structure in which an application 101, a file system 102, a flash translation layer (FTL) 103, and a flash memory 104 are included in the order stated above from top to bottom. Here, the flash memory 104 denotes physically the memory device 20 depicted in FIG. 2.

The application 101 denotes firmware to process the user's data. For example, the application 101 may be document processing software such as a word processor or a document viewer such as computer software and a web browser. The application 101 processes user's data in response to an input of the user, and transmits a command to store the processed user's data in the flash memory 104 to the file system 102.

The file system 102 denotes a structure or software used to store the user's data in the flash memory 104. The file system 102 allocates a logical address in which the user's data is stored in response to the command from the application 101. The file system 102 may be a file allocation table (FAT) or NTFS.

In the FTL 103, a process of translating a logical address received from the file system 102 to a physical address for reading/writing operations in the flash memory 104 is performed. The FTL 103 translates a logical address to a physical address by using mapping table information. The address mapping method may use a page mapping method or a block mapping method. In the page mapping method, an address mapping operation is performed in page units, and in the block mapping method, an address mapping operation is performed in block units. Also, a mixed mapping method in which the page mapping and the block mapping are mixed may also be applied. Here, the physical address indicates a data storing location in the flash memory 104.

Figure 7:
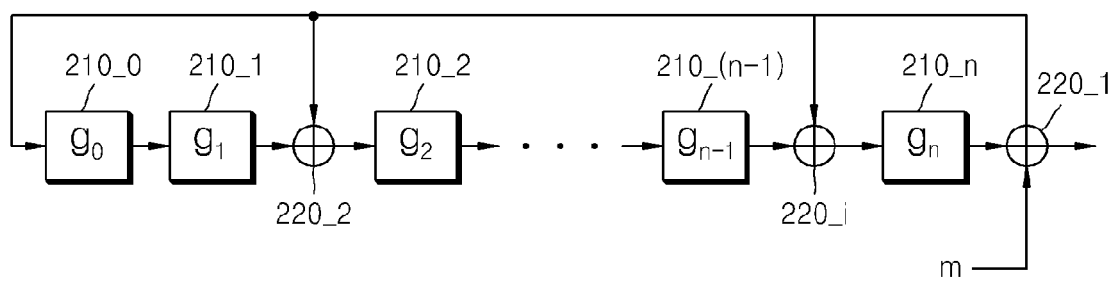
FIG. 7 is a drawing illustrating a basic configuration of a linear feed-back shift register circuit included in a cyclic redundancy check (CRC) processing unit depicted in FIG. 1.

FIG. 7 is a drawing illustrating a basic configuration of an LFSR circuit included in the CRC processing unit 12 depicted in FIG. 1.

The CRC processing unit 12 may perform computation in a binary module by using an XOR gate, and thus, may realize hardware by using the LFSR and the XOR gate.

Referring to FIG. 7, the LFSR circuit includes a plurality of registers 210_0~210_n and XOR gates 220_1~220_i. FIG. 7 illustrates an (n+1) bit LFSR circuit, and as an example, a CRC polynomial based on the CRC-16 or CRC-32 standard can be applied. Of course, the present general inventive concept is not limited thereto, and various types of CRC polynomials may be applied.

The LFSR circuit may have a structure in which the connection between an input bit value of data and the registers 210_0~210_n is determined based on the CRC polynomial, a value that is obtained by an XOR operation of an output value of a front end register and the input bit value is applied to an input terminal of the register that corresponds to a degree included in the CRC polynomial, and an output value of the front end register is applied to the input terminal of the register that corresponds to a degree that is not included in the CRC polynomial.

A register initial value of an LFSR circuit having the structure of FIG. 7 is set "0", and when a computation is performed by inputting data to the LFSR circuit, a final register value is equal to FCS information with respect to a binary data row stream.

For example, assume that a CRC polynomial g(x) is Equation 1.

$$g(x)=x^5+x^2+1 \quad \text{[Equation 1]}$$

If input data (message) m is [10100011], and when the message is expressed as a polynomial m(x), it is Equation 2.

$$m(x)=x^7+x^5+x+1 \quad \text{[Equation 2]}$$

When m(x) is raised by 5 bits which are the maximum degree of g(x), and is divided by g(x), Equation 3 is obtained.

$$m(x)*x^5=a(x)*g(x)+r(x) \quad \text{[Equation 3]}$$

Here, a(x) is a quotient of m(x)*x5 divided by g(x), and a remainder is r(x). The maximum degree of r(x) is 4.

When r(x) is obtained in this way, r(x) is [10000]. That is, r(x)=x4. Here, r(x) corresponds to FCS information. The FCS information is also referred to as CRC parity information.

Accordingly, CRC code c(x) is generated as [m(x) FCS], and is [10100011 10000].

In this manner, when the FCS information is obtained by applying the CRC polynomial g(x) as Equation 1 to message m=[11111111] in which all input data are "1", FCS=[10100]. That is, r(x)=x4+x2.

For reference, information read out in clean sectors where there are no data stored in the memory device 20 is all "1".

Figure 15:
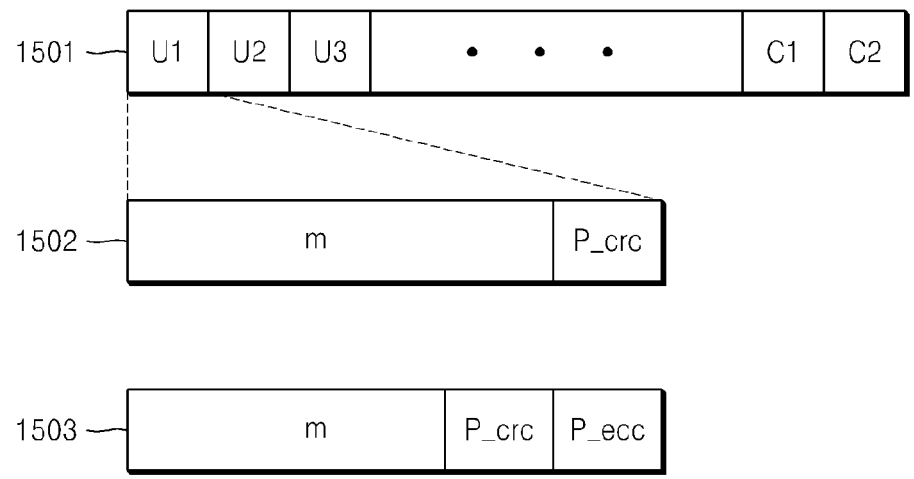
FIG. 15 is a drawing illustrating an exemplary data storage structure of sectors included in a source page in a process of performing the copy-back operation depicted in FIG. 13.

As depicted in a source page 1501 as illustrated in FIG. 15, sectors u1, u2, u3 . . . in which data is written and clean sectors c1 and c2 may co-exist. An access of the host to the clean sectors may not occur since no data is written in the clean sectors. However, in the memory system 100, a copy operation may occur regardless of the access of the host. For example, the copy-back operation may be performed when a garbage collection condition is generated. For example, the garbage collection condition may be set in a condition that the number of free blocks in the memory device 20 is smaller than the number of critical numbers that are initially set. The free blocks indicates blocks in which data is not stored in the memory device 20.

The copy-back operation denotes the movement of data stored in source pages that correspond to effective pages that exist in a victim block to target pages which are empty pages of an active block. The copy-back operation will be described in detail below.

Accordingly, in the copy-back operation, clean sectors may be read. All information that is read from the clean sector may be "1".

However, as described above, in a state that initial value of the register of the LFSR circuit is set as "0", the FCS information with respect to all one message, in which all of input data stream are "1", may not be "1" (that is, all one).

Accordingly, in order to prevent an error of the copy-back operation on the clean sector, it is necessary to have a compensation process so that the FCS information with respect to all one message m in which all rows of input data stream are "1" is all one.

Figure 8:
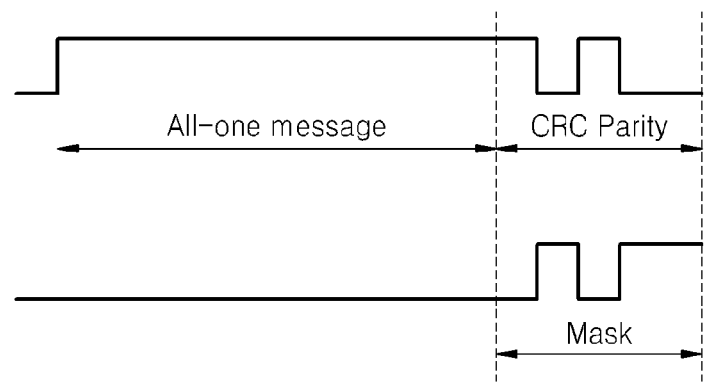
FIG. 8 is a drawing illustrating CRC parity information and a masking processing operation when all bit values of input data is "1" when an initial value of a register of the linear feed-back shift register circuit depicted in FIG. 7 is determined as "0"

The compensation process may be performed so that the FCS information is all one, as depicted in FIG. 8, by masking the CRC parity after generating the CRC parity.

Referring to FIG. 8, after generating mask information q=[01011] with respect to FCS information [10100] of all one message m, the FCS information may be compensated for all one by processing an XOR operation of the q=[01011] with respect to the FCS=[10100].

In order to perform the compensation process, it is necessary to add a circuit to generate a mask pattern and a circuit to process an XOR operation of the mask pattern and the FCS information.

In the present general inventive concept, the circuit to perform compensation is not added, but a method of preventing an error of the copy-back operation according to a clean sector reading operation is proposed.

Figure 9:
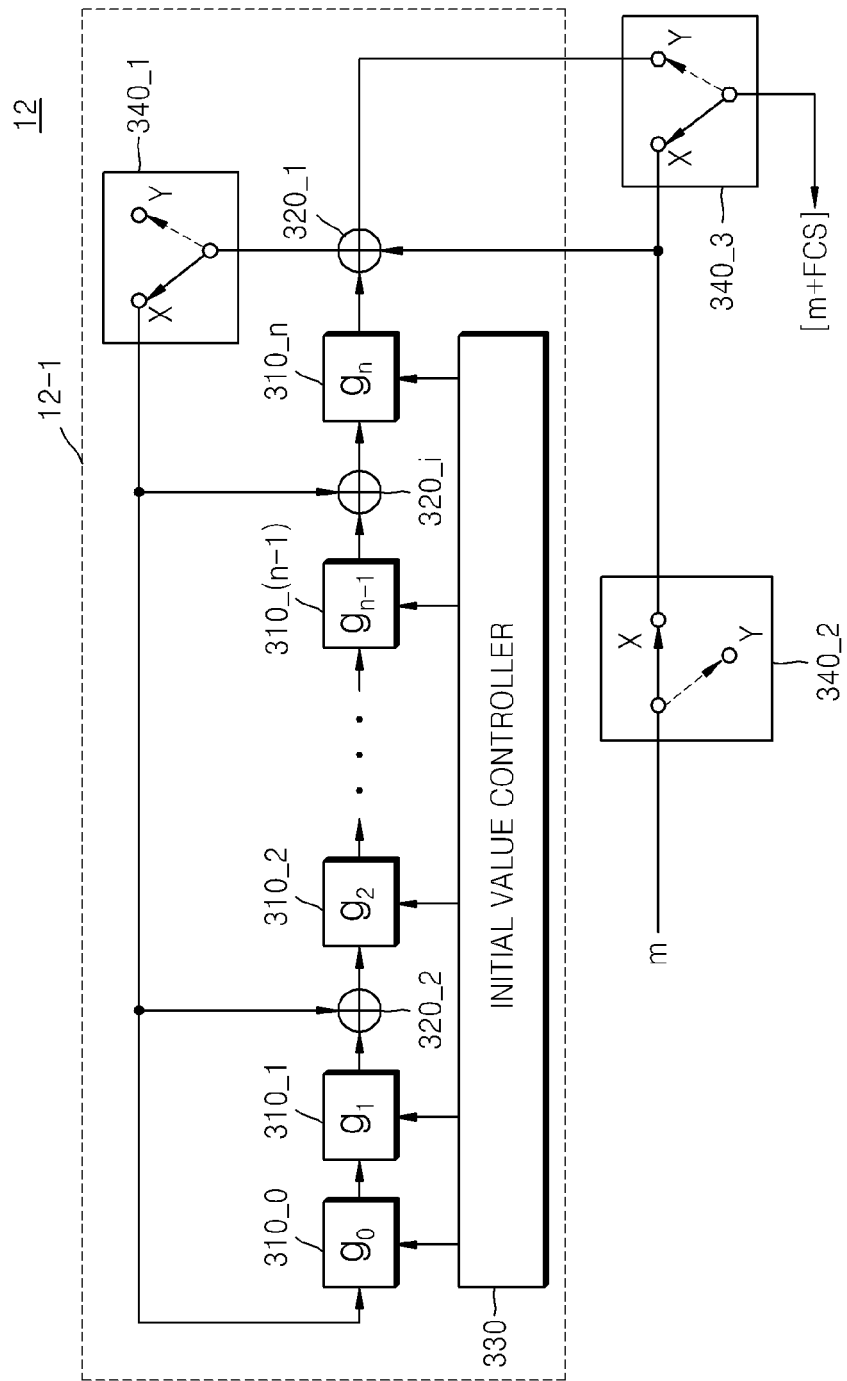
FIG. 9 is a drawing illustrating a configuration of an example of a CRC processing unit included in the memory system of FIG. 1.

FIG. 9 is a drawing illustrating a configuration of an example of a CRC processing unit 12 included in the memory system 100 of FIG. 1.

As depicted in FIG. 9, the CRC processing unit 12 may include a plurality of registers 310_0~310_n, a plurality of XOR gates 320_1~320_i, an initial value controller 330, and a plurality of switches 340_1~340_3.

In FIG. 9, the circuit that includes the registers 310_0~310_n, the XOR gates 320_1~320_i, the initial value controller 330, and the switches 340_1 is an LFSR circuit 12-1.

In the CRC processing unit 12 depicted in FIG. 9, the LFSR circuit 12-1 corresponds to a circuit corresponding to a CRC polynomial, and the register initial value of the LFSR circuit 12-1 may be set to a desired value by the initial value controller 330.

FIG. 9 illustrates an (n+1) LFSR circuit, and as an example, a CRC polynomial based on the CRC-16 or CRC-32 standard may be applied. Of course, the present general inventive concept is not limited thereto, and various types of CRC polynomials may be applied.

In the LFSR circuit 12-1, the connection between input bit values of data and the registers 310_0~310_n is determined based on the CRC polynomial, and a value that is obtained by an XOR operation of an output value of a front end register and the input bit value is applied to an input terminal of the register that corresponds to a degree included in the CRC polynomial, and an output value of the front end register is applied to the input terminal of the register that corresponds to a degree that is not included in the CRC polynomial.

The initial value controller 330 performs an operation of setting initial values of the registers that comprise the LFSR circuit 12-1. For example, the initial value controller 330 sets initial values of the registers 310_0~310_n to desired values before a single data of a CRC processing unit is input to the LFSR circuit 12-1.

A method of determining the initial values of the registers 310_0~310_n will now be described.

When a length of a binary data row stream is L, an operation by the (n+1) LFSR circuit depicted in FIG. 9 may be expressed as a matrix of Equation 4.

$$\begin{bmatrix} r_0 \\ r_1 \\ \vdots \\ r_n \end{bmatrix} = \underbrace{A(g(x), L) \begin{bmatrix} m_0 \\ m_1 \\ \vdots \\ m_L \end{bmatrix}}_{a} + B(g(x), L) \begin{bmatrix} g_0 \\ g_1 \\ \vdots \\ g_n \end{bmatrix}$$ [Equation 4]

Here, r0~rn are CRC parity information, m0~mL are input data, g0~gN are values of the registers 310_0~310_n of the LFSR circuit 12-1, g(x) is a CRC polynomial, and L is the length of input data. The matrices A and B are determined by the CRC polynomial and the length of the data row.

From Equation 4, the register initial values of the LFSR circuit may be determined such that, when the data input to the LFSR circuit is first state information, CRC parity information generated from the LFSR circuit satisfies a condition to be second state information.

For example, all of the first and second information may be determined identical to a pattern read out from the clean sector where no data is written in the memory device 20. As an example, the first and second information may determine each of the bit values as "1".

A process of determining the register initial values of the LFSR circuit by using Equation 4 will be described.

In Equation 4, operated vector values a may be obtained in a state that input data m0~mL is set as the first state information, and g0~gn are all set to "0".

The vector values a obtained as above and a vector having the second state information undergo an XOR operation. Afterwards, a result of multiplying a computed result by an inverse matrix of matrix B, which is initially set, may be determined as the register initial value of the LFSR circuit.

For example, in Equation 4, in a state that all input data m0~mL is set as "1" and all g0~gn are set as "0", the operated vector values a may be obtained.

For example, in a 64 bit-LFSR circuit, a register initial value of the LFSR circuit may be obtained by a computation according to Equation 5.

$$\begin{bmatrix} g_0 \\ g_1 \\ \vdots \\ g_{63} \end{bmatrix} = B^{-1} \left( \begin{bmatrix} 1 \\ 1 \\ \vdots \\ 1 \end{bmatrix} \oplus a \right)$$ [Equation 5]

Referring to Equation 5, after performing an XOR operation on the vector values a obtained above and all one vector, when the result is multiplied by an inverse matrix of the matrix B, which is already determined, a register initial value of the LFSR circuit may be obtained.

The register initial value of the LFSR circuit obtained as above is stored in the memory device 20 or the memory controller 10.

Accordingly, the initial value controller 330 may set a register initial value of the LFSR circuit by using the initial value stored in the memory device 20 or the memory controller 10.

In FIG. 9, the switches 340_1~340_3 are connected to the X port at an initial stage. For example, the message m may be formed of $m_0, m_1, \ldots, m_L$. Messages $m_0, m_1, \ldots, m_L$ are sequentially supplied bit-by-bit to the LFSR circuit 12-1. After supplying the last bit $m_L$ of the message to the LFSR circuit 12-1, the switches 340_1~340_3 move to a Y port. The LFSR circuit 12-1 sequentially outputs from the rightmost register 310_n to the leftmost register 310_0.

In the switch 340_3, a CRC code to which CRC parity information is added to the message is finally output.

In this manner, since the register initial value of the LFSR circuit 12-1 is set by the initial value controller 330, when message bits $m_0 \sim m_L$ input to the LFSR circuit 12-1 are all "1", all the CRC parity information outputted from the LFSR circuit 12-1 may be "1".

According to the operation described above, the CRC encoding process may be performed.

A CRC decoding process may also be performed in the same manner as the CRC encoding process by using the LFSR circuit as depicted in FIG. 9.

In the CRC decoding process, a CRC code (message+CRC parity information) is input instead of a message to the LFSR circuit 12-1. After the CRC code is input to the LFSR circuit 12-1, an error is determined based on FCS information sequentially output from the rightmost register 310_n to the leftmost register 310_0. That is, if the FCS information is "0", it is determined as non-defective data, but if the FCS information is not "0", it may be determined that an error occurs.

Figure 10:
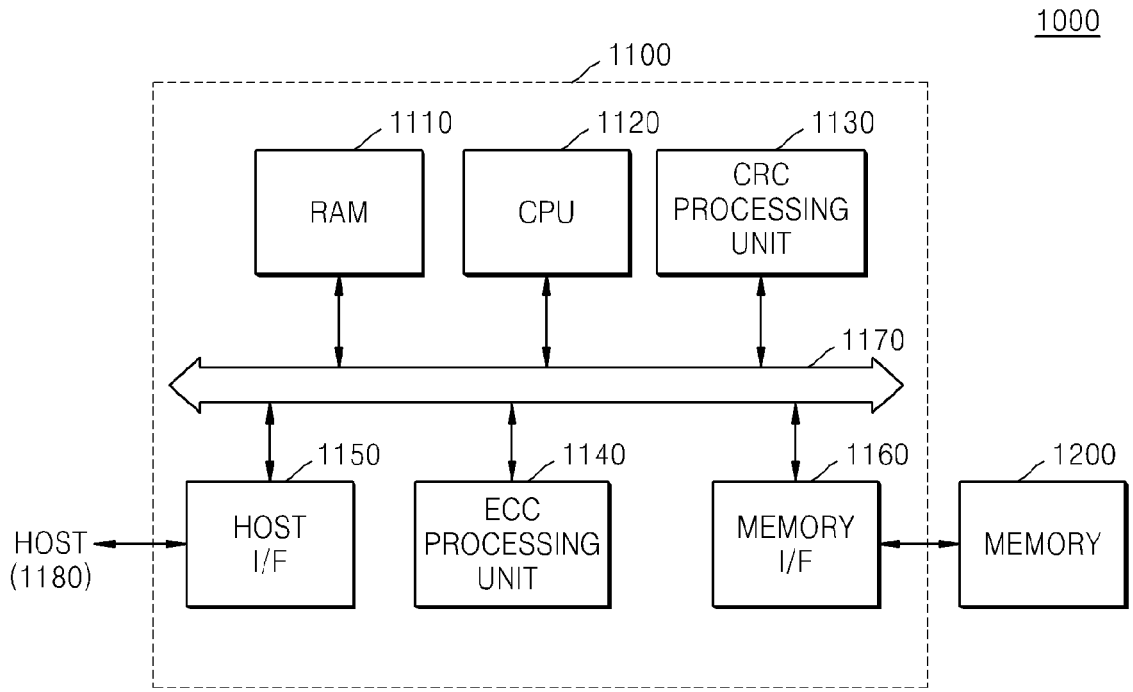
FIG. 10 is a block diagram illustrating a memory system according to another exemplary embodiment of the present general inventive concept.

FIG. 10 is a block diagram illustrating a memory system 1000 according to another exemplary embodiment of the present general inventive concept.

Referring to FIG. 10, the memory system 1000 includes a memory controller 1100 and a memory device 1200.

The memory device 1200 may be realized as a non-volatile semiconductor memory device, and more specifically, a flash memory, a PRAM, a ferroelectric RAM (FRAM), or a MRAM. The memory device 1200 has substantially the same components as that of the memory device 20 of FIG. 1, and thus, a description thereof is not repeated.

For example, when the memory device 1200 is a nonvolatile semiconductor memory such as a flash memory, the memory system 1000 may be a solid state drive (SSD). The memory controller 1100 controls an erasing, a writing, or a reading operation of the memory device 1200 in response to a command received from a host 1180. Also, the memory controller 1100 controls the memory system 1000 to perform a copy-back operation.

The memory controller 1100 includes RAM 1110, a CPU 1120, a CRC processing unit 1130, an error correction code (ECC) processing unit 1140, a host interface 1150, a memory interface 1160, and a bus 1170.

The bus 1170 is a transmitting path of data between the components of the memory controller 1100.

The CPU 1120 controls overall operation of the memory system 1000. For example, the CPU 1120 interprets a command received from the host 1180, and controls the memory system 1000 to perform an operation according to the interpreting result. Also, the CPU 1120 may perform a control operation on the memory device 1200 so that the memory device 1200 performs a copy-back operation by which data stored in a source page of the memory device 1200 moves to a target page.

In a reading operation, the CPU 1120 provides a reading command and an address to the memory device 1200, and in a writing operation, the CPU 1120 provides a write command, an address, and data to the memory device 1200. Also, the CPU 1120 may perform a translating process by which a logical address is translated to a physical address.

The CPU 1120 controls the memory system 1000 to perform a write operation or a read operation in the memory system 1000 according to the present general inventive concept. For example, the CPU 1120 may control the memory system 1000 to perform a method of performing a write operation or a read operation in the memory systems according to embodiments of the present general inventive concept depicted in FIGS. 8 through 20.

The RAM 1110 may temporarily store data transmitted from the host 1180 or may temporarily store data read from the memory device 1200. Also, the RAM 1110 may store data that is read from the memory device 1200 and is required to control the memory system. The RAM 1110 may be realized by a DRAM or an SRAM.

For example, data required to control a memory system may include metadata. Also, the RAM 1110 may store various initial value information required to operate the memory system 1000. For example, the various initial value information required to operate the memory system 1000 may include register initial value information of the LFSR circuit 12-1 that is included in the CRC processing unit 1130. For example, the register initial value information of the LFSR circuit 12-1 may be stored in the memory device 1200. When power is supplied to the memory system 1000, the register initial value information with respect to the LFSR circuit 12-1 is read from the memory device 1200 by the control of the CPU 1120, and the read register initial value information may be stored in the RAM 1110. For example, the register initial value information of the LFSR circuit 12-1, as described above, may be determined by using Equations 4 and 5.

For reference, metadata may include information to manage the memory system 1000. The metadata, which is management information, may include mapping table information that is used to translate a logical address to a physical address of the memory device 1200.

The host interface 1150 includes a data exchange protocol to exchange data with the host 1180 that is connected to the memory system 1000 and connects the memory system 1000 to the host 1180. The host interface 1150 may be an advanced technology attachment (ATA) interface, a serial advanced technology attachment (SATA) interface, a parallel advanced technology attachment (PATA) interface, a universal serial bus (USB) or a serial attached small (SAS) computer system interface, a small computer system interface (SCSI), an embedded multimedia card (eMMC) interface, a unix file system (UFS) interface. However, the above interfaces are examples, and the host interface 1150 is not limited thereto. In more detail, the host interface 1150 may exchange a command, an address, and data with the host 1180 according to control of the CPU 1120.

The memory interface 1160 is electrically connected to the memory device 1200. The memory interface 1160 exchanges a command, an address, and data with the memory device 1200 according to control of the CPU 1120. The memory interface 1160 may be configured to support a NAND flash memory or a NOR flash memory. The memory interface 1160 may be configured to selectively perform a software and hardware interleave operation.

The operation of the CRC processing unit 1130 is substantially the same as that of the CRC processing unit 12 depicted in FIG. 1, and thus, a description thereof is not repeated.

The ECC processing unit 1140 may generate an ECC with respect to receiving data by using an algorithm such as a reed-Solomon code or a hamming code when a writing operation is performed. Also, when a read operation is performed, the ECC processing unit 1140 may perform an error detection process and an error correction process on received data by using the ECC that is read together with the data.

Referring to FIG. 15, if the operation of the ECC processing unit 1140 is omitted, as depicted in source page 1502, a message m and CRC parity information P_crc are stored in the sector of the memory device 1200. If both the operations of the CRC processing unit 1130 and the ECC processing unit 1140 are performed, as depicted in source page 1503, a message m, CRC parity information P_crc, and ECC information P_ecc are stored in the memory device 1200.

Now, methods of performing a CRC operation and a garbage collection processing that are performed according to the control operation of the CPU 1120 in the memory system 1000 will be described with reference to FIGS. 11 through 14.

Figure 11:
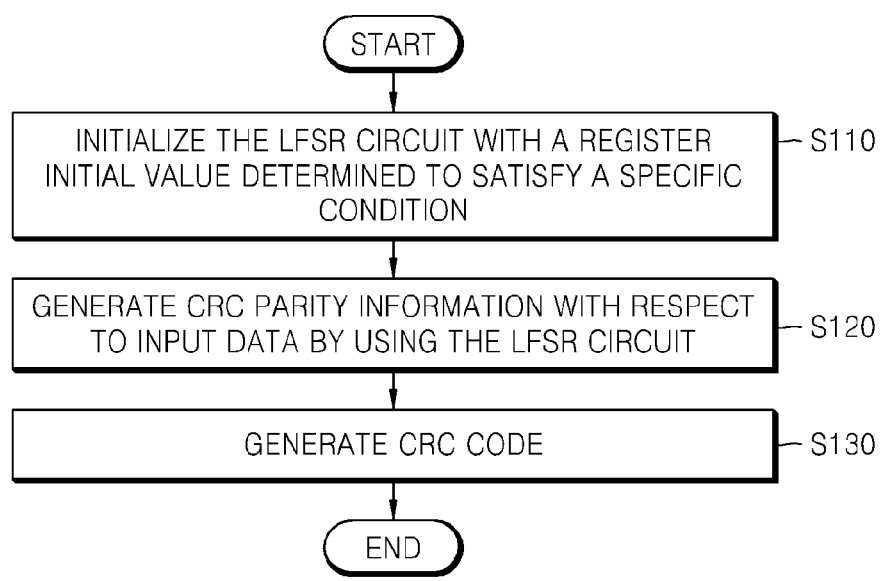
FIG. 11 is a flowchart illustrating a method of performing a CRC operation in a memory system, according to an exemplary embodiment of the present general inventive concept.

A method of performing a CRC operation in the memory system 1000, according to an exemplary embodiment of the present general inventive concept, will be described with reference to FIG. 11.

The CPU 1120 controls the memory system 1000 to initialize the LFSR circuit corresponding to a CRC polynomial (S110). The CPU 1120 initializes the LFSR circuit with a register initial value that is determined to satisfy a specific condition.

For example, the CPU 1120 sets a register value of the LFSR circuit included in the CRC processing unit 1130 with a register initial value of the LFSR circuit, which is stored in the RAM 1110.

For example, the CPU 1120 transmits a control signal to initialize the LFSR circuit to the initial value controller 330 of the LFSR circuit 12-1 wherever an initializing condition is detected. Then, the initial value controller 330 performs an operation of setting initial values of the registers 310_0~310_n using the register initial value stored in the RAM 1110. More specifically, the initialization condition of the LFSR circuit may include a state in which a CRC processing with respect to data (message) by the CRC processing unit 1130 is requested and a state before data of the CRC processing unit is input to the LFSR circuit 12-1.

Accordingly, based on the CRC processing request, before the data of the CRC processing unit is input, the initial value of the registers of the LFSR circuit 12-1 may be set as the register initial value stored in the RAM 1110.

According to the initialization process described above, the register initial value of the LFSR circuit may be set such that the CRC parity information generated when input data to the LFSR circuit is first state information satisfies a condition to be second state information. For example, all bit values of the first state information and the second state information respectively may be determined as "1". For example, the first state information and the second state information may be determined as the same pattern of information read from a clean sector of the memory device 1200 where no data is recorded. As described above, the register initial value of the LFSR circuit set according to an initialization process may be obtained based on Equations 5 and 6.

The CPU 1120 controls the memory system 1000 to generate CRC parity information with respect to input data by using the LFSR circuit that is initialized as in operation S110 (S120). For example, the CPU 1120 may generate CRC parity information with respect to input data by using the LFSR circuit 12-1 of the CRC processing unit 12 as depicted in FIG. 9.

The CPU 1120 controls the memory system 1000 to generate a CRC code with respect to input data based on the CRC parity information generated in operation S120 (S130). For example, the CPU 1120 may generate a CRC code by controlling the switches 340_1~340_3 in the CRC processing unit 12, as depicted in FIG. 9. That is, as described with reference to FIG. 9, a CRC code with respect to input data may be generated by adding the CRC parity information to the input data.

Next, a method of performing garbage collection process in the memory system 1000 according to the current exemplary embodiment will be described with reference to the flowchart of FIG. 12.

The CPU 1120 determines whether a garbage collection condition in the memory system 1000 is detected (S210). For example, the garbage collection condition may be detected when the number of free blocks in the memory device 1200 is smaller than a critical number of free blocks that are initially set. The free blocks denote blocks in which data is not stored in the storage of the memory device 1200.

If a garbage collection condition is detected, the CPU 1120 selects victim blocks among the data blocks of the memory device 1200 (S220). Here, the data blocks denote blocks in which data is stored and pages to which data can be stored are exhausted. For example, a data block that has the least garbage collection cost may be selected as the victim block. The more invalid pages that exist within a block, the less the garbage collection cost.

Next, the CPU 1120 controls the memory system 1000 to copy data stored in a valid page that exists in the victim block to an empty page of an active block by performing a copyback operation (S230). Here, the active block denotes a block in which data is stored and has spare pages where data can be stored. If the active block is not present, the memory controller 210 controls the memory system 1000 to copy data stored in the valid page that exists in the victim block to a free block.

Figure 12:
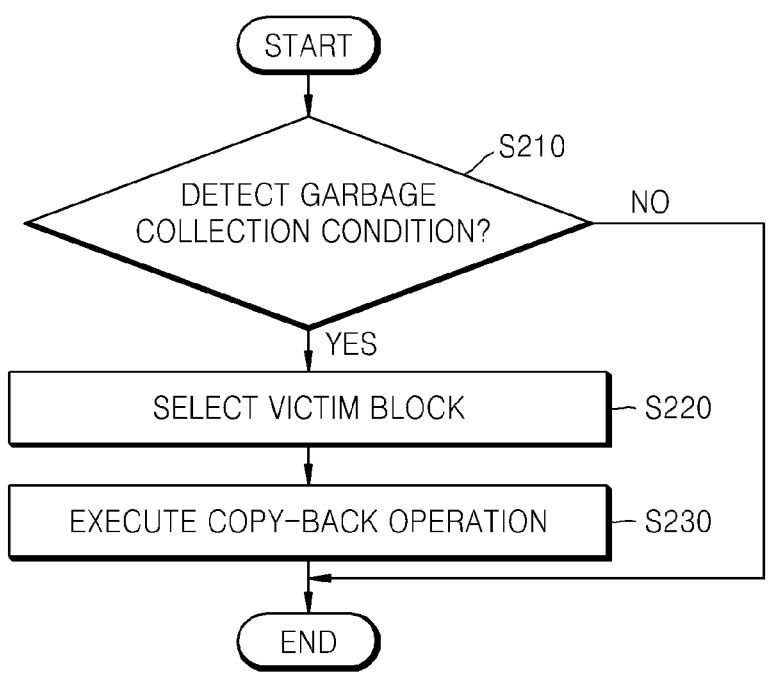
FIG. 12 is a flowchart illustrating a garbage collection method according to another exemplary embodiment of the present general inventive concept.
Figure 13:
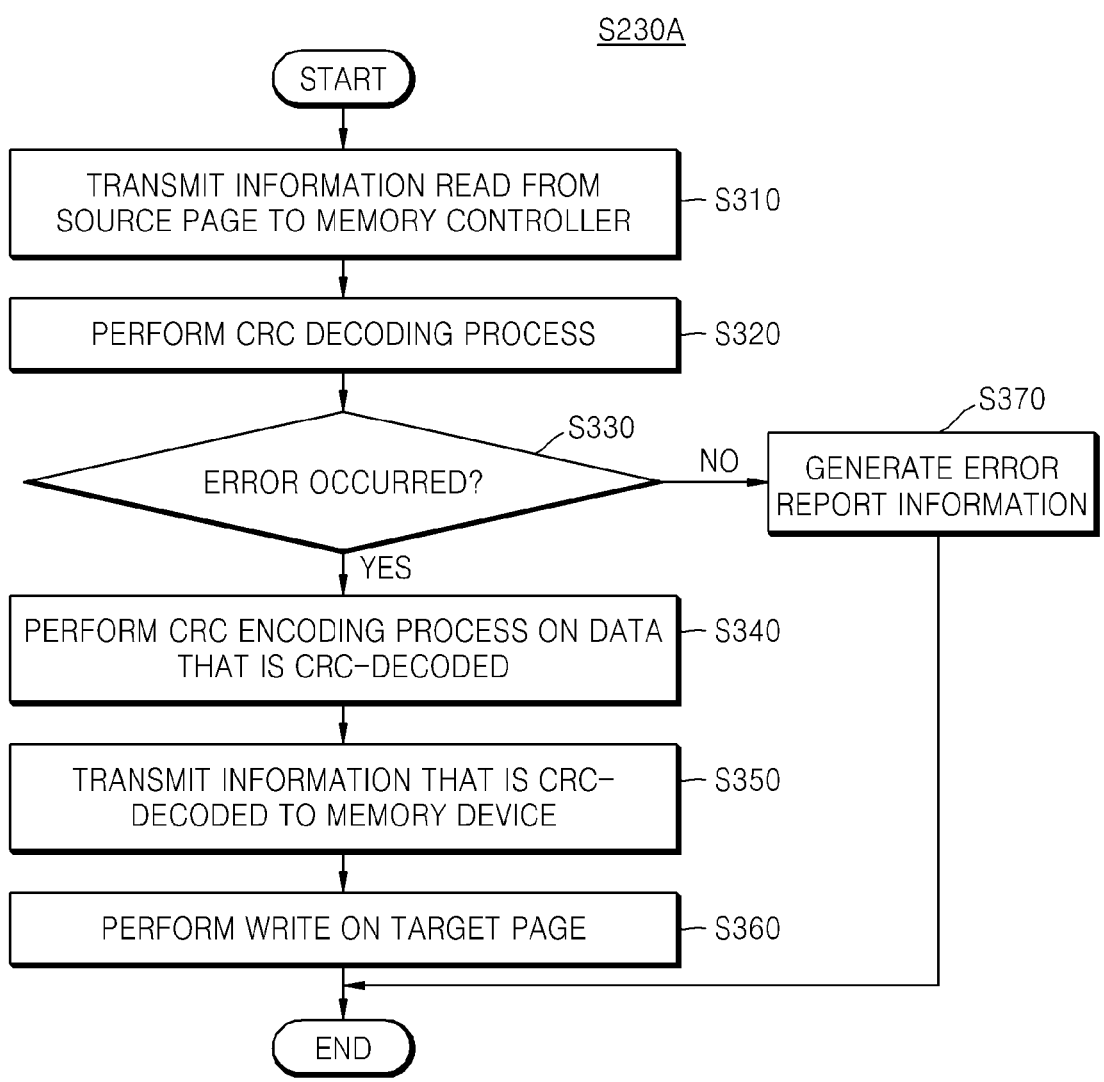
FIG. 13 is a detailed flowchart illustrating the performance of a copy-back operation depicted in FIG. 12, according to an exemplary embodiment of the present general inventive concept.

FIG. 13 is a detailed flowchart illustrating the performance of a copy-back operation (S230) depicted in FIG. 12, according to an exemplary embodiment of the present general inventive concept.

The copy-back operation (S230A) of FIG. 13, according to an exemplary embodiment of the present general inventive concept, may be performed in the memory system 1000 by the CPU 1120 depicted in FIG. 10.

The CPU 1120 controls the memory system 1000 to transmit information read from a source page of the memory device 1200 to the memory controller 1100 (S310). For example, the source page may be one of the valid pages included in the victim block that is selected by a garbage collection operation. The source page may be configured of a plurality of sectors, and may include clean sector in which no data is written.

The CPU 1120 controls the memory system 1000 to perform a CRC decoding process on information received from the memory device 1200 (S320). For example, by the control of the CPU 1120, the CRC decoding process may be performed by the CRC processing unit 12 depicted in FIG. 9. For example, the CRC decoding may be performed sector-by-sector. The LFSR circuit is initialized before performing the CRC decoding process. For example, the LFSR circuit may be initialized before performing the CRC decoding process on the sector unit data.

For example, the initial value of the LFSR circuit may be set as the register value obtained based on Equations 5 and 6. Also, information received from the memory device 1200 may be a form in which a CRC parity is added to the data as a CRC code.

The CPU 1120 examines the result of the CRC decoding process in terms of whether there is an error (S330). For example, if FCS information is "0" as the result of the CRC decoding process, the data is determined to have data integrity without an error. Otherwise, if the FCS information is not "0" as the result of the CRC decoding process, it is determined that there is an error.

When no error occurred as a result of operation S330, the CPU 1120 controls the memory system 1000 to perform a CRC encoding process on the data that is CRC decoding processed (S340). For example, the CRC encoding process may be performed by the CRC processing unit 12 depicted in FIG. 9 by the control of the CPU 1120. The LFSR circuit is initialized before performing the CRC encoding process. For example, the initial value of the LFSR circuit may be set using the register value obtained based on Equations 5 and 6. A CRC code, in which CRC parity information is added to data, is generated when the CRC encoding process is performed by the CRC processing unit 12.

For example, all bit values of data that is CRC decoding processed with respect to information read from a clean sector are "1". Also, all bit values of CRC parity information generated by the CRC encoding process on data having all bit values of "1" are "1". Accordingly, when a CRC encoding process is performed on data read from the clean sector by using the LFSR circuit, all bit values of the CRC code are "1".

The CPU 1120 controls the memory system 1000 to transmit information the CRC encoding processed in operation S340 to the memory device 1200 (S350). The information that is CRC encoded denotes a CRC code.

The CPU 1120 controls the memory system 1000 to write the CRC code transmitted from the memory controller 1100 in a target page of the memory device 1200 (S360). Here, the target page corresponds to the active block process or a page included in the free block determined in the garbage collection.

If an error is detected as a result of operation S330, the CPU 1120 generates information notifying that an error is detected in the transmitted data and terminates operation (S370).

Figure 14:
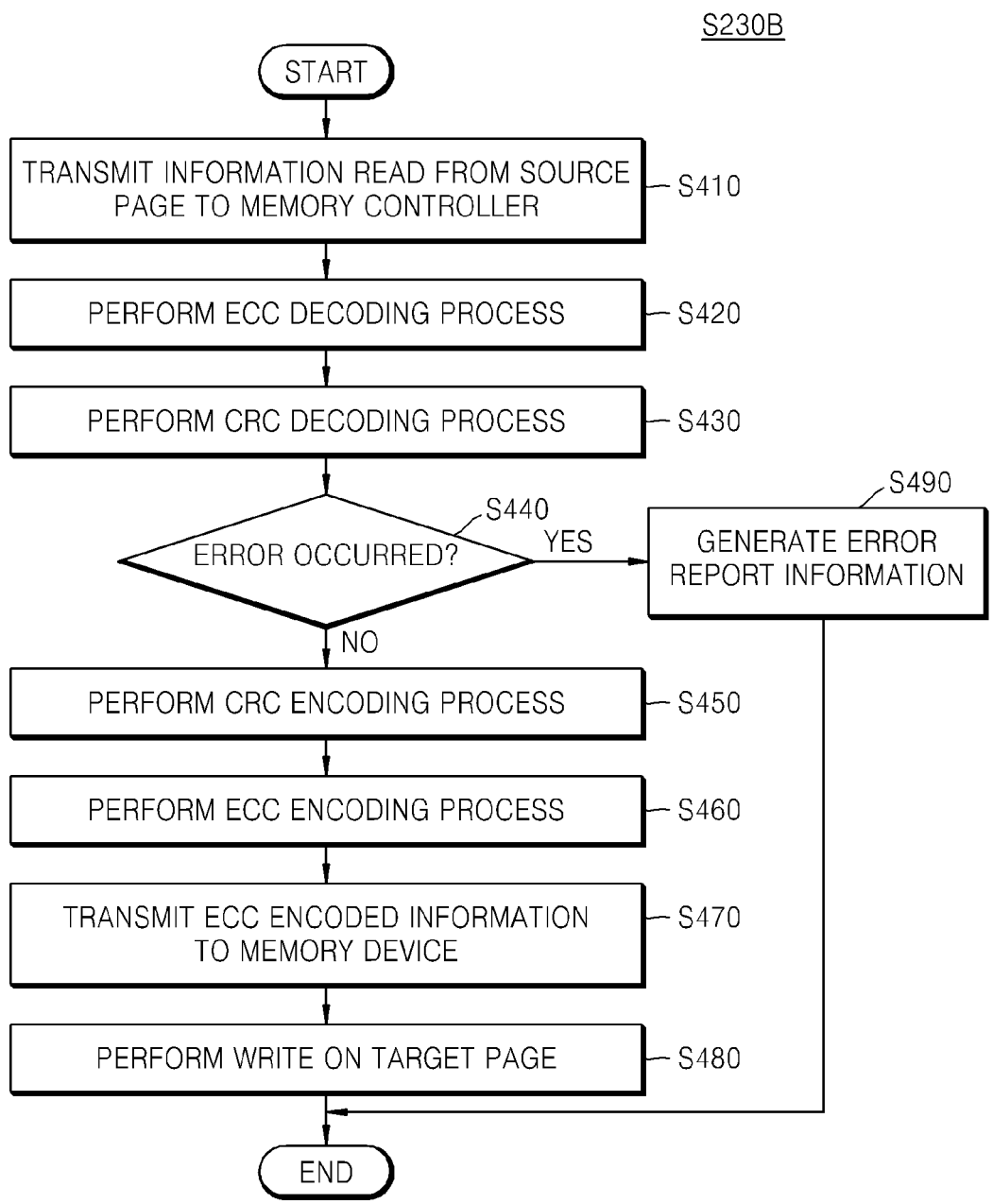
FIG. 14 is a detailed flowchart illustrating the performance of a copy-back operation depicted in FIG. 12, according to another exemplary embodiment of the present general inventive concept.

FIG. 14 is a detailed flowchart illustrating the performance of a copy-back operation (S230) depicted in FIG. 12, according to another exemplary embodiment of the present general inventive concept.

The copy-back operation (S230B) according to another exemplary embodiment of the present general inventive concept may be performed by the memory system 1000 by the control of the CPU 1120.

The CPU 1120 controls the memory system 1000 to transmit information read from the source page of the memory device 1200 to the memory controller 1100 (S410). For example, the source page may be one of valid pages included in the victim block that is selected by the garbage collection operation. The source page is configured of a plurality of sectors, and may include clean sectors in which no data is written.

The CPU 1120 controls the memory system 1000 to perform an ECC decoding process on information received from the memory device 1200 (S420). For example, processes of detecting and correcting error with respect to data may be performed by the ECC processing unit 1140 by the control of the CPU 1120 by using the ECC parity information. For example, information input to the ECC processing unit 1140 may be (data+CRC parity information+ECC parity information). Then, the ECC processing unit 1140 may detect an error with respect to CRC code (data+CRC parity information) by using the ECC parity information, and may correct the detected error.

Next, the CPU 1120 controls the memory system 1000 to perform a CRC decoding process on a CRC code that is ECC decoded (S430). For example, the CRC decoding may be performed by the CRC processing unit 12 depicted in FIG. 9 by the control of the CPU 1120. For example, the CRC decoding process may be performed in sector units. The LFSR circuit is initialized before performing the CRC decoding process. For example, the LFSR circuit may be initialized before performing a CRC decoding process on the sector unit data. For example, the initial value of the LFSR circuit may be set as the register value obtained based on Equations 5 and 6.

The CPU 1120 examines the result of the CRC decoding process in terms of whether there is an error (S440). For example, if FCS information is "0" as a result of the CRC decoding process, the data is determined to have data integrity without an error. Otherwise, if the FCS information is not "0" as a result of the CRC decoding process, it is determined that there is an error.

If there is no error as a result of operation S440, the CPU 1120 controls the memory system 1000 to perform a CRC encoding process on the data that is CRC decoding processed (S450). For example, the CRC encoding process may be performed by the CRC processing unit 12 depicted in FIG. 9 by the control of the CPU 1120. The LFSR circuit is initialized before performing the CRC encoding process. For example, the initial value of the LFSR circuit may be set using the register value obtained based on Equations 5 and 6. A CRC code, in which CRC parity information is added to data, is generated when the CRC encoding process is performed by the CRC processing unit 12.

For example, all bit values of data that is CRC decoding processed with respect to information read from a clean sector are "1". Also, all bit values of CRC parity information generated by the CRC encoding process on data having all bit values of "1" are "1". Accordingly, when a CRC encoding process is performed on data read from the clean sector by using the LFSR circuit, all bit values of the CRC code are "1".

The CPU 1120 controls the memory system 1000 to perform an ECC encoding process on the CRC code that is processed at operation S450 (S460). When the encoding is processed by the ECC processing unit 1140 according to the control of the CPU 1120, ECC parity information is added to the CRC code. That is, information such as (data+CRC parity information+ECC parity information) is outputted from the ECC processing unit 1140.

The CPU 1120 controls the memory system 1000 to transmit the information that is ECC encoded in operation S460 to the memory device 1200 (S470).

Next, the CPU 1120 controls the memory system 1000 to write the ECC encoding information (data+CRC parity information+ECC parity information) transmitted from the memory controller 1100 to a target page of the memory device 1200 (S480). Here, the target page corresponds to a page included in an active block or a free block that is determined at a garbage collection process.

Otherwise, if an error is detected as a result of operation S440, the CPU 1120 generates information notifying that an error is detected in the transmitted data and terminates the operation (S490).

Figure 16:
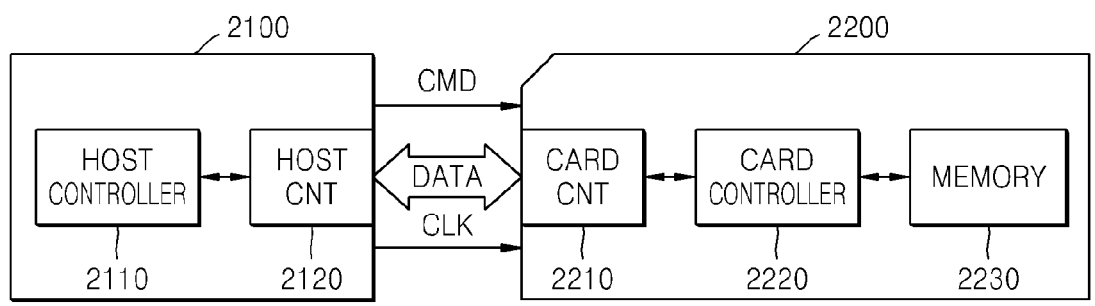
FIG. 16 is a block diagram illustrating an example of applying a memory system according to exemplary embodiments of the present general inventive concept to a memory card.

FIG. 16 is a block diagram illustrating an example of applying a memory system according to exemplary embodiments of the present general inventive concept to a memory card.

Referring to FIG. 16, a memory card system 2000 may include a host 2100 and a memory card 2200. The host 2100 may include a host controller 2110 and a host connection unit 2120. The memory card 2200 may include a card connection unit 2210, a card controller 2220, and a memory device 2230.

The host 2100 may write data in the memory card 2200 or read out stored data from the memory card 2200. The host controller 2110 may transmit a command CMD, a clock signal CLK generated from a clock generator (not illustrated) in the host 2100, and data DATA to the memory card 2200 through the host connection unit 2120.

The card controller 2220 may store data in the memory device 2230 in synchronization with a clock signal generated from a clock generator (not illustrated) that is disposed in the memory device 2230 in response to a command received through the card connection unit 2210. The memory device 2230 may store data transmitted from the host 2100. The card controller 2220 may be realized as the memory controller 10 depicted in FIG. 1 or the memory controller 1100 depicted in FIG. 10.

The memory card 2200 may be a compact flash card (CFC), a Microdrive, a smart media card (SMC), a multimedia card (MMC), a security digital card (SDC), a memory stick, and a USB flash memory.

Figure 17:
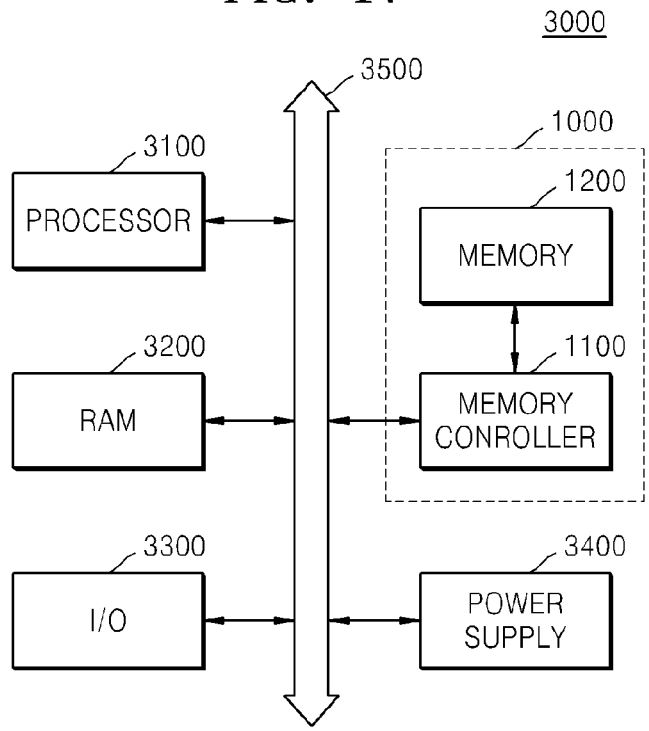
FIG. 17 is a block diagram illustrating a computing system that includes a memory system according to exemplary embodiments of the present general inventive concept.

FIG. 17 is a block diagram illustrating a computing system 3000 that includes a memory system according to exemplary embodiments of the present general inventive concept.

Referring to FIG. 17, the computing system 3000 may include a processor 3100, a RAM 3200, an Input/Output device 3300, a power supply device 3400, and a memory system 1000. The memory system 1000 may include a memory 1200 to store data therein, and a memory controller 1100 to control data movement into and out of the memory 1200. Although not illustrated in FIG. 17, the computing system 3000 may further include ports to allow communicating with a video card, a sound card, a memory card, and a USB device, or other electronic devices. The computing system 3000 may be a portable electronic device such as a personal computer, a notebook computer, a mobile phone, a personal data assistant, a camera, etc.

The processor 3100 may perform a specific calculation or a task. According to the current exemplary embodiment, the processor 3100 may be a micro-processor or a CPU. The processor 3100 may perform communication with the RAM 3200, the Input/Output device 3300, and the memory system 1000 through a bus 3500 such as an address bus, a control bus, and a data bus. According to the current exemplary embodiment, the processor 3100 may be connected to an external bus such as a peripheral component interconnect (PCI) bus.

The RAM 3200 may store data required to operate the computing system 3000. For example, the memory device 3200 may be realized as DRAM, mobile DRAM, SRAM, PRAM, FRAM, RRAM, and/or MRAM.

The Input/Output device 3300 may include input elements such as keyboards, keypads, and mice and output elements such as printers and displays. The power supply device 3400 may supply an operating voltage required to operate the computing system 3000.

Figure 18:
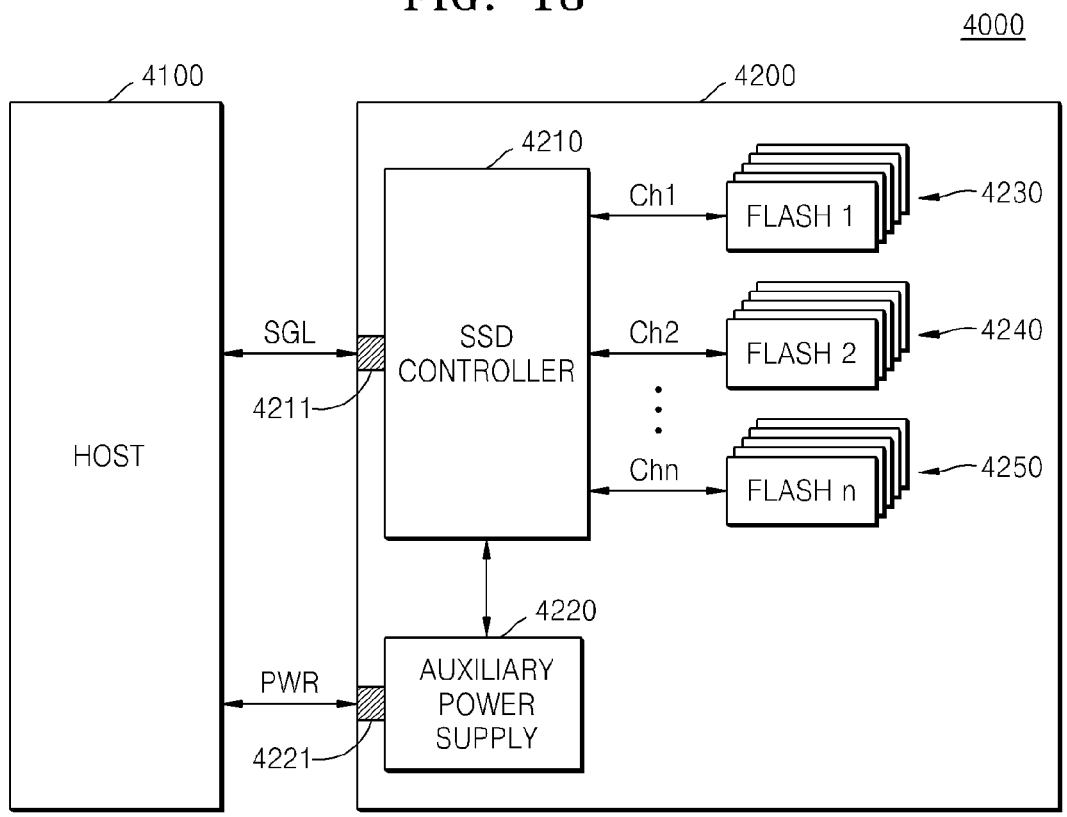
FIG. 18 is a block diagram illustrating an example of applying a memory system according to exemplary embodiments of the present general inventive concept to a solid state drive.

FIG. 18 is a block diagram illustrating an example of applying a memory system according to exemplary embodiments of the present general inventive concept to a solid state drive (SSD) 4200.

Referring to FIG. 18, an SSD system 4000 may include a host 4100 and the SSD 4200. The SSD 4200 may exchange signals with the host 4100 through a signal connector (SGL) 4211, and may receive power through a power connector (PWR) 4221. The SSD 4200 may include an SSD controller 4210, an auxiliary power supply device 4220, and a plurality of memory devices 4230, 4240, and 4250. The memory devices 4230, 4240, and 4250 may include FLASH memory, but are not limited thereto. Also, the SSD controller 4210 may include functions of the memory controller 10 of FIG. 1 or the memory controller 1100 of FIG. 10.

Figure 19:
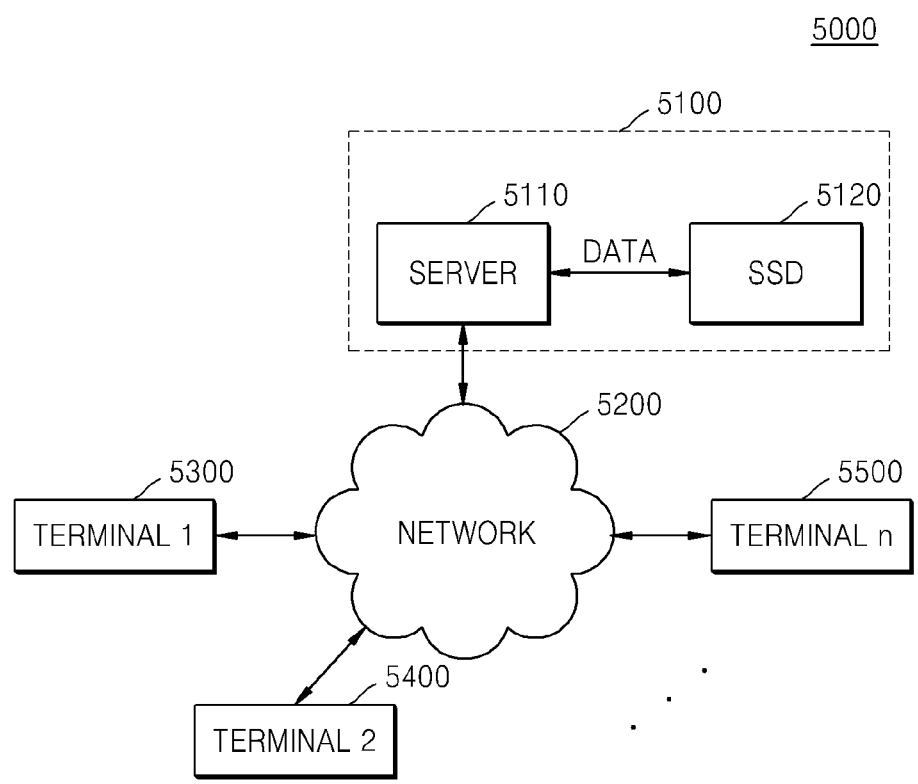
FIG. 19 is a block diagram illustrating a server system that includes the SSD of FIG. 18 and a network system.

FIG. 19 is a block diagram illustrating a server system 5100 that includes the SSD 4200 of FIG. 18 and a network system 5000.

Referring to FIG. 19, the network system 5000 according to an exemplary embodiment of the present general inventive concept may include the server system 5100 and a plurality of terminals 5300, 5400, and 5500, which are connected through a network 5200. The server system 5100 according to the current exemplary embodiment may include a server 5110 that processes requests received from the terminals 5300, 5400, and 5500 that are connected to the network 5200 and an SSD 5120 that stores data corresponding to the requests received from the terminals 5300, 5400, and 5500. At this point, the SSD 5120 may be the SSD 4200.

The flash memory system according to the present general inventive concept described above may be mounted by using various types of packages. For example, the memory system according to the present general inventive concept may be mounted by using packages such as package on package (PoP), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), and Wafer-Level Processed Stack Package (WSP).

While the present general inventive concept has been particularly shown and described with reference to exemplary embodiments thereof, it will be understood by those of ordinary skill in the art that various changes in form and details may be made therein without departing from the spirit and scope of the present general inventive concept as defined by the following claims.

What is claimed is:

1. A method of operating a cyclic redundancy check (CRC) operation in a memory system, the method comprising:
    selecting a reference state defined by a predetermined reference pattern of bit values;
    initializing, by a memory controller, a linear feed-back shift register (LFSR) circuit that corresponds to a CRC polynomial;
    generating CRC parity information with respect to input data to be stored in a memory device by using the LFSR circuit; and
    generating a CRC code with respect to the input data based on the CRC parity information,
    wherein the initialization of the LFSR circuit by the memory controller is set such that a register initial value of the LFSR circuit is determined to satisfy a condition that, when data input to the LFSR circuit is first state information having the predetermined reference pattern of bit values, the CRC parity information generated from the LFSR circuit is second state information defined by second bit values based on the CRC polynomial.

2. The method of claim 1, wherein the LFSR circuit is configured such that bit values of the first state information and the second state information have the same bit pattern based on the first state information having the same bit pattern as the reference state.

3. The method of claim 2, wherein the LFSR circuit is configured such that the first state information and the second state information have the same bit pattern based on all the bit values in the first state information having a value of "1".

4. The method of claim 1, wherein the predetermined reference Pattern of bit values is defined by a bit pattern of bits in a clean sector of the memory device in which no data is written.

5. The method of claim 1, wherein the register initial value of the LFSR circuit is determined by using operated vector values in a state that input data m0~mL is set as the first state information and register values g0~gn of the LFSR circuit are set as "0" in a matrix that expresses an operation process of the LFSR circuit, as shown below, wherein, r0~rn are CRC parity information, m0~mL is input data, g0~gn are the register values of the LFSR circuit, g(x) is CRC polynomial, and L is a length of input data row:

$$\begin{bmatrix} r_0 \\ r_1 \\ \vdots \\ r_n \end{bmatrix} = A(g(x), L) \underbrace{\begin{bmatrix} m_0 \\ m_1 \\ \vdots \\ m_L \end{bmatrix}}_{a} + B(g(x), L) \begin{bmatrix} g_0 \\ g_1 \\ \vdots \\ g_n \end{bmatrix}.$$

6. The method of claim 5, wherein determining the register initial value of the LFSR circuit comprises, after performing an XOR operation of the operated vector values and a vector having the second state information, determining an inverse matrix of the matrix B and multiplying the inverse matrix of the matrix B to a value resulting from the XOR operation.

7. The method of claim 1, wherein the generating of the CRC code comprises generating the CRC code with respect to the input data by adding the CRC parity information to the input data.

8. A memory controller comprising:
    a central processing unit (CPU) to perform a control operation on a memory device to control the memory device to perform a copy-back operation by which data stored in a source page is moved to a target page; and
    a cyclic redundancy check (CRC) processing unit to perform a CRC encoding or decoding process on input data of the copy-back operation by using a linear feed-back shift register (LFSR) circuit that corresponds to a CRC polynomial,
    wherein the memory controller sets a register initial value of the LFSR circuit such that when data input to the LFSR circuit is first state information defined by first bit values corresponding to a predetermined reference bit pattern, the CRC parity information generated from the LFSR circuit is second state information defined by second bit values based on the CRC polynomial.

9. The memory controller of claim 8, wherein the predetermined reference bit pattern is defined by a bit pattern of a clean sector of the memory device where no data is written.

10. The memory controller of claim 8, wherein the predetermined bit pattern comprises all bit values being "1".

11. The memory controller of claim 8, wherein the LFSR circuit comprises a plurality of registers and XOR gates and,
    wherein the LFSR circuit is configured to perform an XOR operation of an output value of a front-end register and the input bit values and to apply a value obtained by the XOR operation to an input terminal of a first register from among the plurality of registers that corresponds to a degree included in the CRC polynomial, and
    wherein the LFSR circuit is configured to apply an output value of the front-end register to the input terminal of a second register from among the plurality of registers that corresponds to a degree that is not included in the CRC polynomial.

12. The memory controller of claim 8, wherein the memory device comprises a flash memory device.

13. The memory controller of claim 8, wherein the CRC processing unit generates frame check sequence (FCS) information by inputting a CRC code read from the source page to the LFSR circuit according to the copy-back operation, and performs a CRC decoding process that checks defectiveness of data included in the CRC code based on the FCS information.

14. The memory controller of claim 8, wherein the CRC processing unit generates parity information by inputting data that is verified as non-defective by performing the CRC decoding process on the CRC code read from the source page according to the copy-back operation, and performs a CRC encoding process that generates a CRC code by adding the CRC parity information to the data input to the LFSR circuit.

15. The memory controller of claim 8, wherein the CRC processing unit comprises:
the LFSR circuit that is configured to perform an operation corresponding to the CRC polynomial with respect to the input data; and
an initial value controller to initialize registers that constitute the LFSR circuit with a target initial value,
wherein the target initial value is determined to satisfy a condition that when data input to the LFSR circuit is first state information defined by the first bit values, and the first bit values are the same as the predetermined reference bit pattern, the CRC parity information generated from the LFSR circuit is the second state information defined by the second bit values based on the CRC polynomial.

16. A memory system, comprising:
a memory device to store a plurality of data blocks;
a central processing unit (CPU) to select a victim block from among the plurality of data blocks in response to a determination that a number of free blocks in the memory device is smaller than a critical number of free blocks that are initially set; and
a cyclic redundancy check (CRC) processing unit to perform a CRC encoding operation on CRC decoded data read from a valid page of the victim block by using a linear feed-back shift register (LFSR) circuit that corresponds to a CRC polynomial; and
a memory controller to copy the CRC encoded data to an empty page of a free block or an active block of the memory device,
wherein the memory controller is configured to control the LFSR circuit such that when data input to the LFSR circuit is first state information defined by first bit values, and the first bit values have a predetermined reference bit pattern, the CRC parity information generated from the LFSR circuit is second state information defined by second bit values based on the CRC polynomial.

17. The memory system of claim 16, wherein the memory controller controls the memory system to copy data stored in the valid page that exists in the victim block to a free block in response to the active block not being present.

18. The memory system of claim 16, wherein the CRC encoding operation comprises dividing the CRC decoded data by the CRC polynomial and adding a remainder to an end portion of the CRC decoded data.

19. The memory system of claim 16, wherein the CRC processing unit decodes the data read from the valid page of the victim block by dividing the data read from the valid page of the victim block by a predetermined polynomial to determine whether a remainder is zero.

* * * * *